(12) United States Patent
Pandey

(10) Patent No.: US 10,700,810 B2
(45) Date of Patent: Jun. 30, 2020

(54) PHYSICAL LAYER DEVICE AND METHOD FOR PERFORMING PHYSICAL LAYER OPERATIONS IN A COMMUNICATIONS NETWORK

(71) Applicant: NXP B.V., Eindhoven (NL)

(72) Inventor: Sujan Pandey, Waalre (NL)

(73) Assignee: NXP B.V., Eindhoven (NL)

( * ) Notice: Subject to any disclaimer, the term of this patent is extended or adjusted under 35 U.S.C. 154(b) by 56 days.

(21) Appl. No.: 16/122,749

(22) Filed: Sep. 5, 2018

(65) Prior Publication Data
US 2020/0076532 A1    Mar. 5, 2020

(51) Int. Cl.
*H03M 13/00* (2006.01)
*H04L 1/00* (2006.01)
*H04L 29/08* (2006.01)

(52) U.S. Cl.
CPC .......... *H04L 1/0041* (2013.01); *H04L 1/0045* (2013.01); *H04L 69/323* (2013.01)

(58) Field of Classification Search
CPC .... H04L 1/0041; H04L 1/0045; H04L 69/323
See application file for complete search history.

(56) References Cited

U.S. PATENT DOCUMENTS

| | | | |
|---|---|---|---|
| 7,020,076 B1 | 3/2006 | Alkalai et al. | |
| 7,212,496 B1 | 5/2007 | Chong | |
| 7,542,513 B2* | 6/2009 | Propp | H04L 1/0003 375/260 |
| 7,676,733 B2* | 3/2010 | Ganga | H03M 13/33 714/775 |
| 7,733,426 B2* | 6/2010 | Lee | H04N 21/235 348/726 |
| 8,335,439 B2* | 12/2012 | Khermosh | H04L 1/0009 398/141 |
| 9,503,228 B2* | 11/2016 | Subhedar | H04L 1/24 |
| 9,628,340 B2* | 4/2017 | Blair | G06N 7/005 |
| 9,654,250 B2* | 5/2017 | Effenberger | H04L 7/041 |
| 9,819,444 B2* | 11/2017 | Shen | H04L 1/0041 |
| 9,866,425 B1 | 1/2018 | Lo | |
| 2003/0206564 A1 | 11/2003 | Mills et al. | |

(Continued)

OTHER PUBLICATIONS

Non-Final Office Action for U.S. Appl. No. 16/122,740; 27 pgs. (dated Jan. 27, 2020).

(Continued)

*Primary Examiner* — Esaw T Abraham
(74) *Attorney, Agent, or Firm* — Rajeev Madnawat

(57) ABSTRACT

Embodiments of a method and a device are disclosed. In an embodiment, a method for performing physical layer operations in a communications network is disclosed. The method involves determining a desired error management mode for a receiver at a first network node, at the first network node, embedding an indication of the desired error management mode into a forward error correction (FEC) frame, and transmitting the FEC frame from the first network node. In an embodiment, embedding an indication of the desired error management mode into an FEC frame includes embedding an operations, administration, and management (OAM) word into the FEC frame to communicate the indication of the desired error management mode.

8 Claims, 11 Drawing Sheets

(56) References Cited

U.S. PATENT DOCUMENTS

| | | |
|---|---|---|
| 2004/0013129 A1* | 1/2004 | Fang .................... H04J 3/1617 370/466 |
| 2005/0050424 A1* | 3/2005 | Matsuura .............. H04L 1/0061 714/748 |
| 2007/0127443 A1 | 6/2007 | Spencer et al. |
| 2008/0025204 A1 | 1/2008 | Radha et al. |
| 2013/0121685 A1 | 5/2013 | Rao et al. |
| 2015/0326348 A1 | 11/2015 | Shen et al. |
| 2016/0359893 A1 | 12/2016 | Kishikawa et al. |
| 2017/0205272 A1 | 7/2017 | Zhang et al. |
| 2018/0270195 A1 | 9/2018 | Bathurst et al. |

OTHER PUBLICATIONS

Final Rejection for U.S. Appl. No. 16/122,740, 33 pgs., (dated May 19, 2020).

* cited by examiner

PHYSICAL LAYER DEVICE AND METHOD FOR PERFORMING PHYSICAL LAYER OPERATIONS IN A COMMUNICATIONS NETWORK

BACKGROUND

Modern automobiles include various electronic control units (ECUs) that implement, for example, engine control, power train control, airbag systems, antilock brake systems, cruise control, electric power steering, audio systems, window control systems, door control systems, mirror adjustment systems, and battery and recharging systems for hybrid/electric cars. The ECUs communicate with each other in an automobile via in-vehicle network (IVN) technologies such as Ethernet, Controller Area Network (CAN), and FlexRay. As electric powered automobiles become more popular, it is important that ECUs operate efficiently in terms of, for example, energy consumption and heat generation.

SUMMARY

Embodiments of a method and a device are disclosed. In an embodiment, a method for performing physical layer operations in a communications network is disclosed. The method involves determining a desired error management mode for a receiver at a first network node, at the first network node, embedding an indication of the desired error management mode into a forward error correction (FEC) frame, and transmitting the FEC frame from the first network node.

In an embodiment, embedding an indication of the desired error management mode into an FEC frame includes embedding an operations, administration, and management (OAM) word into the FEC frame to communicate the indication of the desired error management mode.

In an embodiment, the OAM word is embedded into the FEC frame at a physical coding sublayer transmitter (PCS-TX) of the first network node.

In an embodiment, determining a desired error management mode includes selecting either error correction or error detection as the desired error management mode.

In an embodiment, determining a desired error management mode includes reading a register bit at the physical layer.

In an embodiment, The method of claim 4, wherein determining a desired error management mode includes reading a register bit at the physical layer that is set by a layer higher than the physical layer.

In an embodiment, the method further involves, at a second network node receiving the FEC frame at a receiver of the second network node, extracting the indication of the desired error management mode from the FEC frame, configuring the receiver of the second network node to operate in an error management mode using the indication of the desired error management mode, and operating the receiver of the second network node in the error management mode as configured using the indication of the desired error management mode.

In an embodiment, the receiver of the second network node operates in either an error correction mode or an error detection mode.

In an embodiment, the method further involves embedding an OAM word into the FEC frame to communicate the indication of the desired error management mode.

In an embodiment, the OAM word is embedded into the FEC frame at a physical coding sublayer transmitter (PCS-TX) of the first network node and wherein the OAM word is extracted from the FEC frame at a physical coding sublayer receiver (PCS-RX) of the second network node.

In an embodiment, the method further involves, at the first network node receiving an FEC frame at a receiver of the first network node, extracting an indication of the desired error management mode from the FEC frame, configuring the receiver of the first network node to operate in an error management mode using the indication of the desired error management mode, and operating the receiver of the first network node in the error management mode as configured using the indication of the desired error management mode.

An embodiment of a method for performing physical layer operations in a communications network is disclosed. The method involves at a first network node, determining a desired error management mode for a receiver at a first network node, embedding an indication of the desired error management mode into an FEC frame, and transmitting the FEC frame from the first network node. The method also involves, at a second network node receiving the FEC frame at a receiver of the second node, extracting the indication of the desired error management mode from the FEC frame, configuring the receiver of the second network node to operate in an error management mode using the indication of the desired error management mode, and operating the receiver of the second network node in the error management mode as configured using the indication of the desired error management mode.

In an embodiment, embedding an indication of the desired error management mode into an FEC frame includes embedding an OAM word into the payload field of the FEC frame to communicate the indication of the desired error management mode, and wherein the OAM word is embedded into the payload field of the FEC frame at a physical coding sublayer transmitter (PCS-TX) of the first network node and wherein the OAM word is extracted from the FEC frame at a physical coding sublayer receiver (PCS-RX) of the second network node.

In an embodiment, determining a desired error management mode includes selecting either error correction or error detection as the desired error management mode.

In an embodiment, the receiver of the second network node operates in either an error correction mode or an error detection mode.

In an embodiment, determining a desired error management mode includes reading a register bit at the physical layer.

In an embodiment, determining a desired error management mode includes reading a register bit at the physical layer that is set by a layer higher than the physical layer.

An embodiment of a physical layer (PHY) device for a communications network is disclosed. The PHY device includes a transmitter configured to transmit FEC frames from the PHY device, a receiver configured to receive FEC frames at the PHY device, and error management mode logic configured to determine a desired error management mode, provide an indication of a desired error management mode to the transmitter, receive an indication of a desired error management mode from the receiver, and configure the receiver to operate in an error management mode using the indication of the desired error management mode.

In an embodiment, the transmitter is configured to embed an OAM word into an FEC frame before transmission, the OAM word including the indication of the desired error management mode provided by the error management mode logic.

In an embodiment, the receiver is configured to extract an OAM word from the FEC frame and to provide the OAM word to the error management mode logic, the OAM word including an indication of the desired error management mode.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
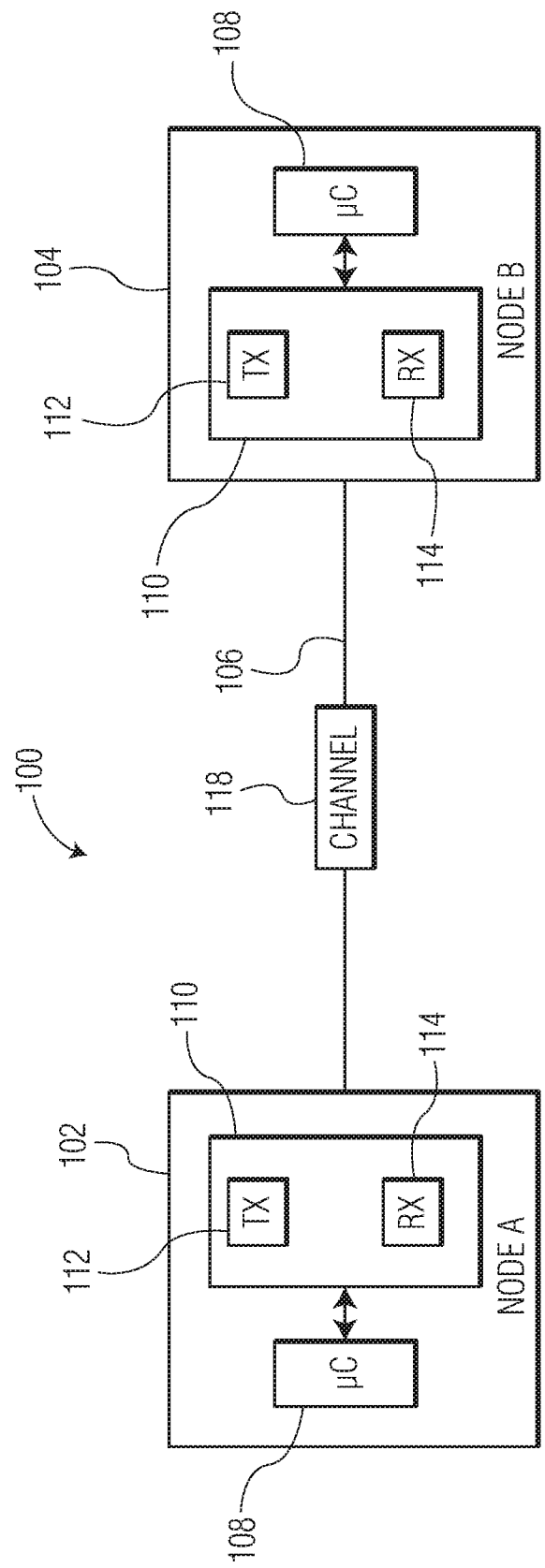
FIG. 1 depicts a communications network that connects two nodes via a physical link.

FIG. 1 depicts a communications network 100 that connects two nodes, node A 102 and node B 104, via a communications medium 106 such as an unshielded twisted pair of copper wires, e.g., 10BASE-T1L. In an embodiment, the network is an in-vehicle network (IVN) that uses Ethernet at the data link layer, as specified in the Open Systems Interconnection (OSI) model as published by the International Organization for Standardization (ISO). Each node includes a microcontroller 108 and a transceiver 110 that includes a transmitter 112 and a receiver 114. Data is communicated in a channel 118 across the communications medium 106. In an embodiment, a channel may be a logical channel that is specified at a layer higher than the physical layer. As used herein, a link or a communications link refers to a communications pathway that is supported by the communications medium, such as twisted pair wires or a single conductor based coax cable, and various communications protocols that are implemented at different layers in the OSI mode to achieve successful data communications between two or more nodes. Although FIG. 1 shows only two nodes in the communications network, the communications network may include more than two nodes. In general, high speed Ethernet (e.g., greater than 10 Mbits/s) uses point-to-point network configurations but there are network configurations that involve point-to-multipoint. The techniques described herein are applicable to point-to-point and point-to-multipoint network configurations. Further, although in some embodiments an Ethernet-based network is described, it should be noted that the invention is not restricted to a specific type of network. The communications network may be, for example, an in-vehicle network (IVN) that utilizes a network technology such as Controller Area Network (CAN), Local Interconnect Network (LIN), Media Oriented Systems Transport (MOST), or FlexRay™. The communications network can be used to enable communications between, for example, various electronic control units (ECUs), such as an engine control module (ECM), a power train control module (PCM), airbags, antilock brakes, cruise control, electric power steering, audio systems, windows, doors, mirror adjustment, battery and recharging systems for hybrid/electric cars, and many more.

In some embodiments, the microcontrollers 108 are connected to at least one device (not shown) such as a sensor, an actuator, or some other control device and are programmed to determine the meaning of received messages and to generate appropriate outgoing messages. In some embodiments, at least one of the microcontrollers includes a host (not shown), which may include, for example, a software application that is stored in memory of the microcontroller and executed by processing circuits of the microcontroller. The microcontrollers, also referred to as host processors, hosts, or digital signal processors (DSPs), are known in the field. In an embodiment, the microcontrollers 108 implement data link layer (i.e., Layer 2) operations as is known in the field, which in an Ethernet-based network may include Logical Link Control (LLC) sublayer operations and/or media access control (MAC) sublayer operations. For example, in a receive operation, a microcontroller stores received serial bits from a corresponding transceiver 110. In a transmit operation, the microcontroller may transmit a message as serial bits in a data frame format to the corresponding transceiver. The microcontrollers may be implemented as, for example, digital signal processors (DSPs) and/or central processing units (CPUs).

The transceivers 110 are located between the microcontrollers 108 and the communications medium 106 and implement physical layer operations. For example, in receive operations, the receivers 114 convert analog signals from the communications medium to digital signals that a corresponding microcontroller can interpret. In an embodiment, the receivers 114 include a DSP to process incoming signals. The transceiver also can protect the microcontroller from extreme electrical conditions on the communications medium, e.g., electrical surges. In transmit operations, the transmitters 112 convert digital bits received from the microcontroller into analog signals that are sent on the communications medium. The transceivers may be any suitable type of transceivers. In some embodiments, the transceivers are Ethernet transceivers. For example, the transceivers may be Institute of Electrical and Electronics Engineers (IEEE) 802.3 compatible Ethernet transceivers. The transceivers may be implemented in suitable analog circuits and/or digital circuits.

In the communications network 100 depicted in FIG. 1, the nodes 102 and 104 are connected to the communications medium 106, which carries analog signals between the communications devices. The communications medium may include one or more conductive wires or lines, which are made of conductive materials (e.g., metals). For example, the communications medium may include one or more coaxial cables, twisted pair cables, or fiber optic cables. In some embodiments, the communications medium includes a communications bus, which carries analog differential signals and includes a high bus line and a low bus line, which may be connected between one or more resistors. However, the network topology of the communications network is not limited to bus topology. Examples of the network topology that can also be used by the communications network includes point-to-point, star, ring or circular, mesh, tree, hybrid, and daisy chain, which are known in the field.

At the physical layer, encoding, such as Forward Error Correction (FEC) encoding, has been used to improve the quality of point-to-point communications across an Ethernet link, for example, to improve the Bit Error Rate (BER) or to meet a minimum BER requirement. At the physical layer, the receivers typically include a decoder, e.g., digital decoder that is implemented in a DSP. The decoder includes processing blocks (e.g., processing blocks of the DSP) for bit decoding and for error detection and correction. DSP processing blocks for bit decoding include, for example, an equalizer block, an echo cancellation block, an automatic gain control (AGC) block, a clock data recovery (CDR) block, and/or a baseline wander (BLW) block. DSP processing blocks for error detection and error correction include, for example, a syndrome calculation block, an error location block, and an error correction block.

When FEC encoding is used at the transmitter, the receiver can use the FEC encoding to detect bit errors and to correct detected bit errors. In an embodiment, the detection of bit errors involves syndrome calculations by the syndrome calculation block and the correction of bit errors involves error location operations by the error location block, and error correction by the error correction block. It should be noted that error detection involves only the error detection operations (e.g., syndrome calculations) while error correction involves error detection operations (e.g., syndrome calculations) to detect errors and error correction operations (e.g., locating errors and correcting errors) to correct errors. For example, error detection codes only have the ability to confirm that bit error(s) have occurred, but they do not provide an indication of which bit is in error. Error correction codes or Forward Error Correction (FEC) codes have the ability to detect bit errors and fix the bit errors without requiring a retransmission. As used herein, error detection refers to the detection of errors that result from, for example, noise or other problems during transmission from a transmitter to a receiver and error correction refers to the detection of errors and the reconstruction of the original data, e.g., as error free digital data. Thus, one mode of operation of a receiver can be referred to as an "error detection" mode and another mode of operation of a receiver can be referred to as "error correction" mode. Implementing error correction at a receiver is typically more processing intensive than implementing only error detection. The more intensive processing typically translates to increased latency and increased power consumption and increased heat generation. Error detection is typically less processing intensive than error correction.

In automotive in-vehicle networks, there may be different requirements for the network depending on the application. Some applications, such as safety critical applications, may have stringent quality-of-service (QoS) requirements, e.g., low BER which needs a scheme to correct longer burst errors and low latency which needs a correction scheme that exhibits low latency. Other applications, such as entertainment applications, can handle a higher BER, but still need low latency. Thus, the specific error management mode (e.g., error detection or error correction) that is desired for a particular application in an in-vehicle network is dependent on the application. In Ethernet based in-vehicle networks, FEC encoding and decoding is implemented at the physical layer, typically by physical layer integrated circuit (IC) devices, referred to herein as "PHY chips." Conventional PHY chips typically can support different levels of FEC encoding and decoding, with a specific level of FEC encoding and/or decoding being either pre-configured in the PHY chips in the network or negotiated between PHY chips during initial set up of a communications link between two nodes, e.g., during a training period. Although this approach works well to initially establish a communication link, the approach does not provide flexibility to adapt to conditions that may change during the lifetime of the communications link, e.g., changes in the requirements of the communications link due to, for example, a change in the application that is utilizing the link.

In accordance with an embodiment of the invention, a technique for performing physical layer operations in a communications network involves determining a desired error management mode for a receiver at a first network node, at the first network node, embedding an indication of the desired error management mode into a forward error correction (FEC) frame, and transmitting the FEC frame from the first network node. In an embodiment, embedding an indication of the desired error management mode into an FEC frame involves embedding an operations, administration, and management (OAM) word into the FEC frame to communicate the indication of the desired error management mode. For example, in an Ethernet network, the OAM word is embedded into the FEC frame at a physical coding sublayer transmitter (PCS-TX) of the first network node. In an embodiment, the desired error management mode is either error correction or error detection in which error correction can provide a lower BER at higher latency and higher power consumption while error detection can provide lower latency and lower power consumption at the expense of possibly a higher BER. For example, one error management mode is desired to be implemented because it will provide better performance than other available error management modes. In an embodiment, the desired error management mode is determined by reading a register bit at the physical layer, for example, a bit that is set by a command that is generated at a layer higher than the physical layer, e.g., by an application. In an embodiment, the indication of the desired error management mode is used to configure a receiver at a receiving end of the network. For example, the technique involves receiving the FEC frame at a receiver of the second network node, extracting the indication of the desired error management mode from the FEC frame, configuring the receiver of a second network node to operate in an error management mode using the indication of the desired error management mode, and operating the receiver of the second network node in the error management mode as configured using the indication of the desired error management mode.

Using an OAM word embedded into an FEC frame to communicate changes in the mode of error management (e.g., error detection or error correction), the mode of error management (e.g., error detection or error correction) can be adjusted in real-time to, for example, adapt to changes in the application that is utilizing the link in the point-to-point network and to adapt to conditions on the link (e.g., burst errors) that may affect the BER. In an embodiment, the desired error management mode is determined at a first node and transmitted to a second node and the error management mode used at the receiving PHY chip is adjusted in real-time in response to the received OAM bits to adapt to changes in the needs of the application. For example, if the application using the link changes to an application with a lower latency requirement (e.g., more delay is acceptable) but a higher BER requirement (e.g., the BER should be low), then the error management mode can be changed to error correction to ensure that the BER requirement is met (e.g., to ensure that the BER is low), which may translate to higher latency and/or higher power consumption and higher heat generation. Alternatively, if the application using the link changes to an application with a higher latency requirement (e.g., delay should be kept to a minimum) but a lower BER requirement (e.g., a higher BER is acceptable), then the error management mode can be changed to implement only error detection, which can reduce the processing burden at the receiver and thereby reduce power consumption and heat generation. Additionally, because the error management mode can be changed at the physical layer (e.g., by the PHY chips) while data is being transmitted across the link, the same PHY chips can be designed into an IVN and adapted to the particular application. Thus, the same type of PHY chip can be mass produced, which can lower the production cost of such PHY chips.

In an embodiment, the desired error management mode is monitored at a node (e.g., through an error management mode register in the PHY chip) and the mode of error management (e.g., error correction or error detection) used at the transmitting PHY chip and the receiving PHY chip is adjusted in real-time to adapt to changes in the error management mode requirement. For example, a higher level layer may signal to the PHY chip that the BER rate requirement for an application has decreased (e.g., that a higher BER is acceptable) and thus the error management mode for upcoming data transmissions across the link can be changed from error correction to error detection, which can reduce the processing requirement, which may improve latency, save power, and reduce heat generation.

Figure 2A:
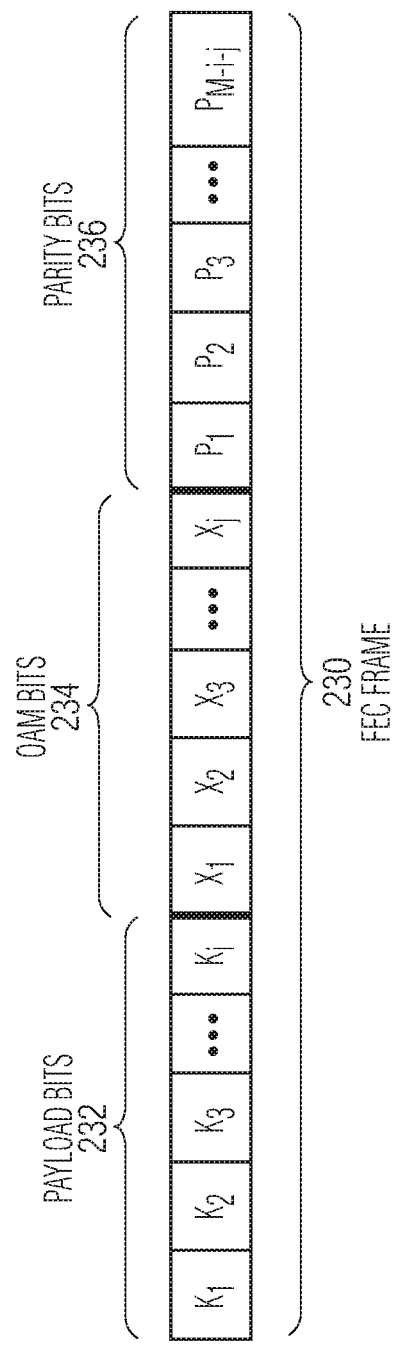
FIG. 2A depicts an example of an FEC frame that can be used to communicate information that is used to set and/or adjust the error management mode in, for example, an Ethernet based in-vehicle network.

As described above, the technique for performing physical layer operations in a communications network involves utilizing an OAM word in an FEC frame. FIG. 2A depicts an example of an FEC frame 230 (M bits) that can be used to communicate information that is used to set and/or adjust the level of interleaving in an Ethernet based in-vehicle network. As depicted in FIG. 2A, the FEC frame 230 includes payload bits 232 (K bits, $K_1, K_2, K_3, \ldots K_i$) and OAM bits 234 (X bits, $X_1, X_2, X_3, \ldots X_j$) (also referred to collectively herein as an "OAM word"), with parity bits 236 (P bits, $P_1, P_2, P_3, \ldots P_{M-i-j}$) interspersed within the payload bits and the OAM bits. In the example of FIG. 2A, the payload bits include bits of data received from a higher layer in the network stack, e.g., from the data link layer and which are intended to be communicated across the link to the same higher layer in the receiving node, the OAM bits include bits of operations, administration, and management information that are communicated between the physical layers (e.g., between the PHY chips) in OAM words, and the parity bits are bits added to strings of binary values in the FEC frame to provide a check on the corresponding bit values in the FEC frame. In an embodiment, an FEC frame is M bits, including K bits of data, X bits of OAM data, and M-K-X parity bits. In an embodiment, an FEC frame makes up a portion of a PDU such as an Ethernet PDU.

Figure 2B:
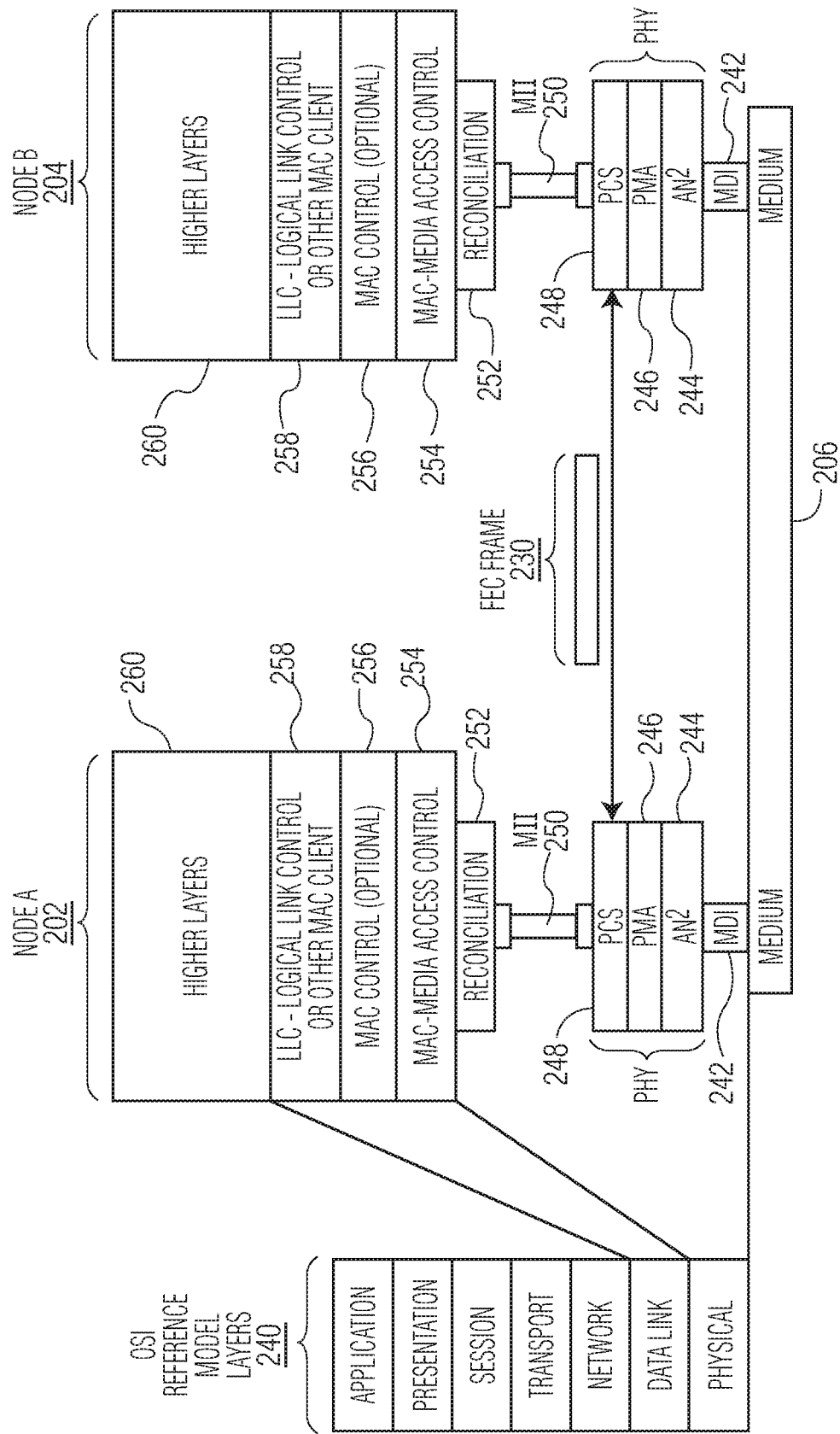
FIG. 2B illustrates the communication of an FEC frame between two nodes in an Ethernet based in-vehicle network.

FIG. 2B illustrates the communication of an FEC frame 230 between two nodes, node A 202 and node B 204, in an Ethernet based in-vehicle network. FIG. 2B depicts the layers of the OSI reference model 240 as well as an expanded view of the physical layer and the data link layer. As shown in FIG. 2B, the OSI reference model includes the physical layer (also referred to as layer 1 or L1), the data link layer (also referred to as layer 2 or L2), the network layer (also referred to as layer 3 or L3), the transport layer (also referred to as layer 4 or L4), the session layer (also referred to as layer 5 or L5), the presentation layer (also referred to as layer 6 or L6), and the application layer (also referred to as layer 7 or L7). Elements in the expanded view of the physical layer include media-dependent sublayers of the transmission medium 206, a media-dependent interface (MDI) 242, an auto-negotiation layer (AN2) 244, a physical medium attachment (PMA) 246, and the physical coding sublayer (PCS) 248, and media-independent sublayers of a media-independent interface (MII) 250, and a reconciliation layer 252. Elements in the expanded view of the data link layer include the media access control (MAC) layer 254, the MAC control layer (optional) 256, and the logical link control (LLC) 258, or other MAC client, layer. Higher layers 260 may be implemented above the data link layer.

Figure 3:
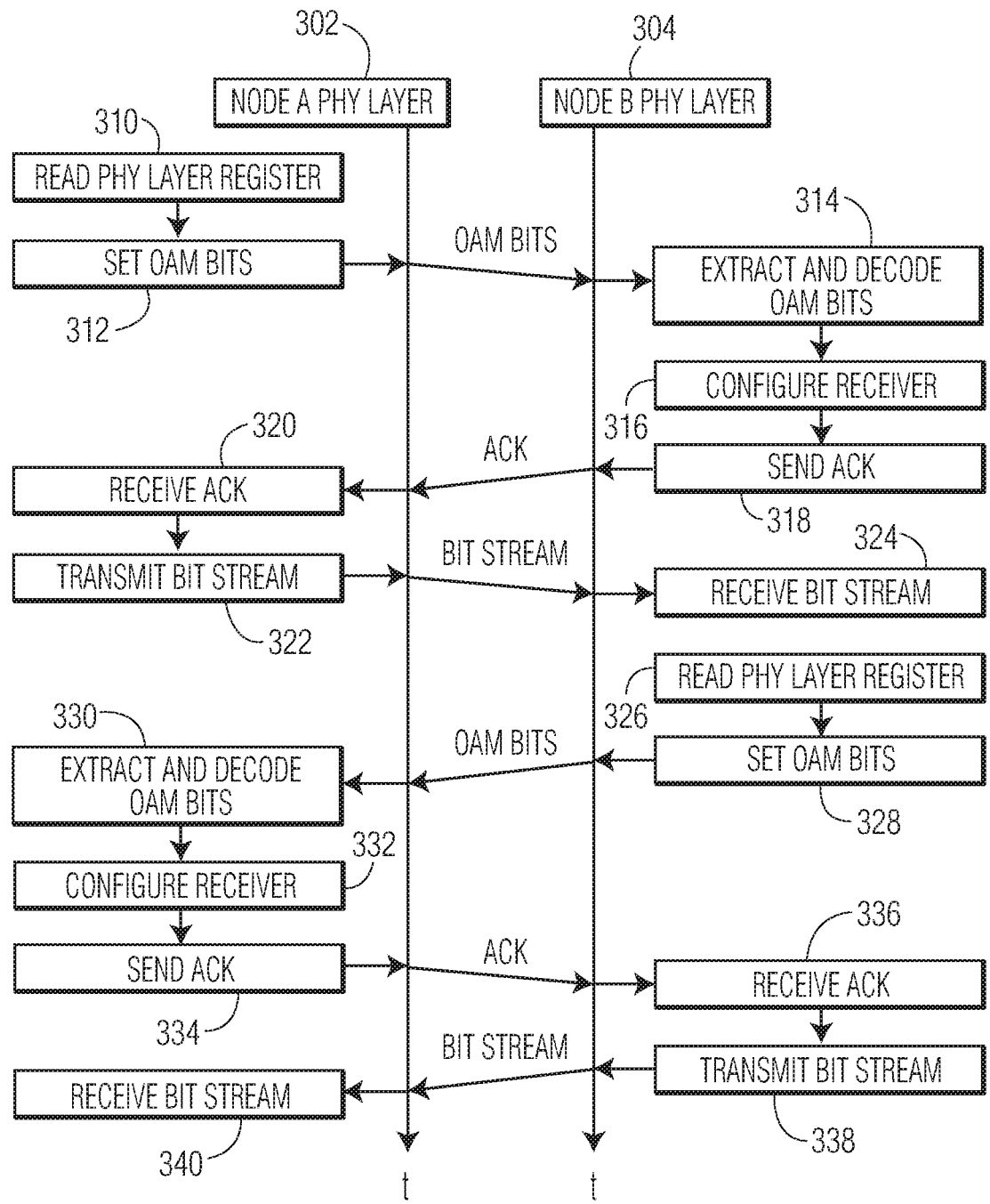
FIG. 3 is a timeline illustration of physical layer operations in a communications network such as the communications described with reference to FIGS. 1, 2A, and 2B.

FIG. 3 is a timeline illustration of physical layer operations in a communications network such as the communications described with reference to FIGS. 1, 2A, and 2B. At block 310, at the physical layer of node A 302, a register that was set by a higher layer of the node is read, which register value provides an indication of the desired error management mode, e.g., either error detection or error correction. At block 312, OAM bits (alternatively, could only be a single OAM bit) are set in response to the register value to provide an indication of the desired error management mode, e.g., error detection or error correction. The OAM bits are then transmitted across the link (e.g., embedded in an FEC frame) to the physical layer of node B. At block 314, the physical layer of node B extracts the OAM bits from the FEC frame and decodes the OAM bits to obtain the indication of the desired error management mode, e.g., error detection or error correction. At block 316, in response to the decoded OAM bits, the receiver at node B is configured to perform either error detection or error correction. For example, if error detection is the desired error management mode, then the receiver only implements error detection and does not perform any error correction. However, if error correction is the desired error management mode, the receiver detects errors and corrects the detected errors. At block 318, the physical layer of node B generates an acknowledgement (ACK) and the ACK is transmitted back to the physical layer of node A. In an embodiment, the ACK indicates that node B has been configured at the physical layer in response to the OAM bits. At block 320, the physical layer of node A receives the ACK and at block 322, a bit stream is transmitted from the physical layer of node A to the physical layer of node B. At block 324, the bit stream is received at node B.

The above process can also be implemented in the opposite direction, e.g., from node B 304 to node A 302. At block 326, at the physical layer of node B, a register that was set by a higher layer of the node is read, which register value provides an indication of the desired error management mode, e.g., either error detection or error correction. At block 328, OAM bits (alternatively, could only be a single OAM bit) are set in response to the register value to provide an indication of the desired error management mode, e.g., error detection or error correction. The OAM bits are then transmitted across the link (e.g., embedded in an FEC frame) to the physical layer of node A. At block 330, the physical layer of node A extracts the OAM bits from the FEC frame and decodes the OAM bits to obtain the indication of the desired error management mode, e.g., error detection or error correction. At block 332, in response to the decoded OAM bits, the receiver at node A is configured to perform either error detection or error correction. For example, if error detection is the desired error management mode, then the receiver only implements error detection and does not perform any error correction. However, if error correction is the desired error management mode, the receiver detects errors and corrects the detected errors. At block 334, the physical layer of node A generates an acknowledgement (ACK) and the ACK is transmitted back to the physical layer of node B. In an embodiment, the ACK indicates that node A has been configured at the physical layer in response to the OAM bits. At block 336, the physical layer of node B receives the ACK and at block 338, a bit stream is transmitted from the physical layer of node B to the physical layer of node A. At block 340, the bit stream is received at node A.

Figure 4:
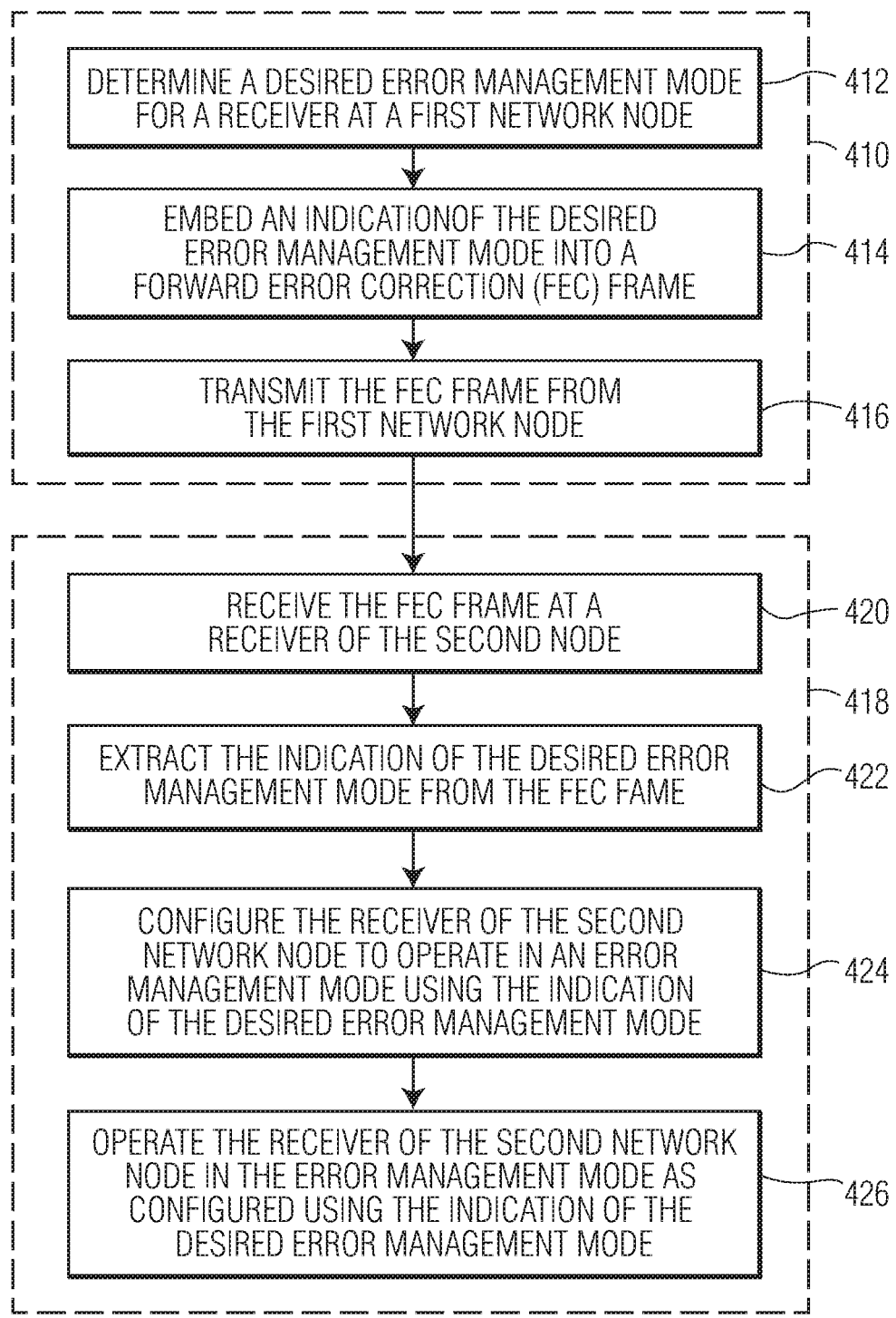
FIG. 4 is a process flow diagram of a method for performing physical layer operations in a communications network such as the communications described with reference to FIGS. 1, 2A, and 2B.

FIG. 4 is a process flow diagram of a method for performing physical layer operations in a communications network. At a first network node as indicated by dashed block 410, at block 412, a desired error management mode is determined for a receiver at a first network node. For example, the desired error management mode is determined from an error management mode register that is set in a physical layer register through a management data input/output (MDIO) interface that communicates between the physical layer and the data link layer of the node. In an embodiment, the error management mode register may indicate a particular error management mode or some other parameter such as minimum/maximum latency time and/or minimum/maximum BER. For example, a higher level layer may signal to the PHY chip that the latency requirement for an application has increased (e.g., less delay is acceptable) and thus the error management mode for upcoming data transmissions across the link can be changed (e.g., changed from error correction to error detection) or the higher level layer may signal to the PHY chip that the latency requirement for an application has decreased (e.g., more delay is acceptable) and thus the error management mode for upcoming data transmissions across the link can be changed (e.g., from error detection only to error correction) to, for example, provide a lower BER. In still another example, a higher level layer may signal to the PHY chip (e.g., by writing a value to a register in error management mode logic) that the application utilizing the link has changed and the error management mode for upcoming data transmissions across the link can be changed (e.g., changed from error correction to error detection) dependent on the needs of the application. At block 414, an indication of the desired error management mode is embedded into an FEC frame (e.g., into an FEC frame corresponding to a PDU). For example, the indication of the desired error management mode is encoded into OAM bits that are embedded into the FEC frame. In one embodiment, the OAM bits identify a specific error management mode and in another embodiment, the OAM bits identify a degree of error detection/error correction. At block 416, the FEC frame is transmitted from the first network node. At a second network node as indicated by dashed block 418, at block 420, the FEC frame is received at a receiver of the second node. At block 422, the indication of the desired error management mode is extracted from the FEC frame. For example, the receiver extracts the OAM bits from the FEC frame and then the OAM bits are decoded into an indication of the desired error management mode. At block 424, the receiver of the second network node is configured to operate in an error management mode using the indication of the desired error management mode. At block 426, the receiver of the second network node is operated in the error management mode as configured using the indication of the desired error management mode. Thus, the error management mode (e.g., either error detection or error correction) used by a receiver in an Ethernet-based network can be communicated between the nodes in an OAM word of an FEC frame that also carries payload data to make real-time adjustments to the error management mode, for example, adjustments to the error management mode that are made in response to information received from a higher layer in the node, e.g., from the application layer.

Figure 5:
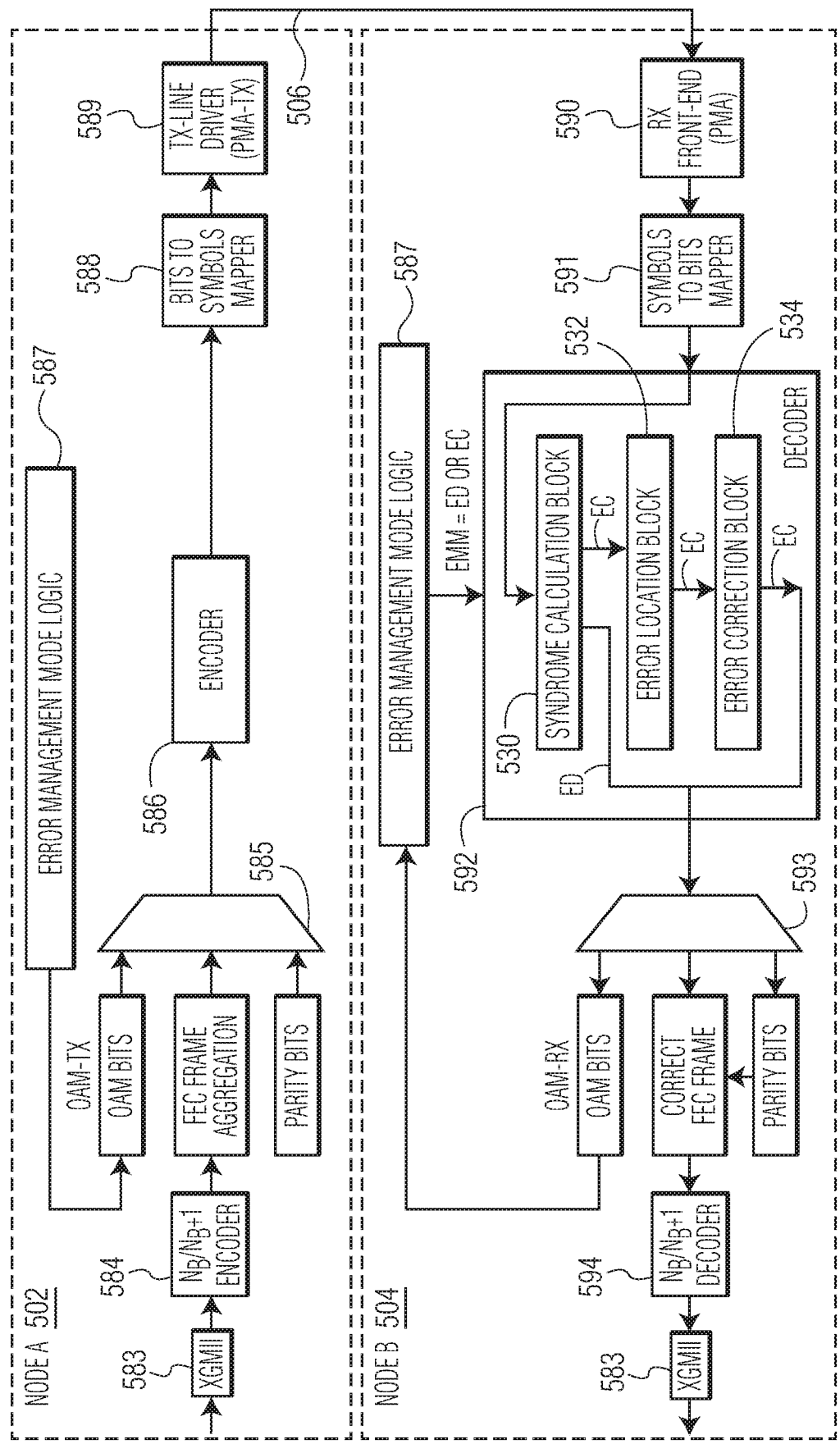
FIG. 5 illustrates the processing of FEC frames at the physical level between two nodes in a network.

FIG. 5 illustrates a process for transmitting and receiving FEC frames at the physical level between two nodes, node A 502 and node B 504, in a point-to-point network that utilizes, for example, Ethernet. In the example of FIG. 5, node A transmits FEC frames on physical link 506 and node B receives the FEC frames on the physical link. As depicted in FIG. 5, node A includes a gigabit MII (XGMII) 583, an $N_B/N_B+1$ encoder 584 (wherein $N_B$ is the number of bits in a word), a multiplexer 585, an encoder 586, error management mode logic 587, a bits-to-symbols mapper 588, and a TX-line driver (PMA-TX) 589, and node B 504 includes an RX front-end (PMA-RX) 590, a symbols-to-bits mapper 591, a decoder 592, error management mode logic 587, a demultiplexer 593, an $N_B/N_B+1$ decoder 594 (wherein $N_B$ is the number of bits in a word), and a gigabit MII (XGMII) 583. Although the physical layer elements shown in FIG. 5 include an $N_BN_B+1$ encoder 584 and an $N_B/N_B+1$ decoder 594, in other embodiments the $N_B/N_B+1$ encoder and decoder may use some other type of encoding/decoding or the $N_B/N_B+1$ encoder and decoder may be omitted.

In the embodiment shown in FIG. 5, the decoder 592 includes processing blocks (e.g., processing blocks of a DSP) that include a syndrome calculation block 530, an error location block 532, and an error correction block 534. In an example, the syndrome calculation block is configured to compute syndrome bits as is known in the field. In an embodiment, error detection may utilize parity codes and/or CRC. In an example, the error location block is configured to locate the bit location of a bit error and the error correction block is configured to correct the bit error without requiring a retransmission of the data. In an example, error correction may utilize Longitudinal Redundancy Check (LRC), Hamming codes, and/or Reed-Solomon codes.

In operation (described from transmission to reception), a bitstream is received at node A 502 (e.g., at a PHY chip) via the XGMII 583 and passed to the $N_B/N_B+1$ encoder 584 for $N_B/N_B+1$ bit encoding. The $N_B/N_B+1$ encoded bits are then combined with OAM bits and parity bits at the multiplexer to form FEC frames. In an embodiment, OAM bits that indicate the desired error management mode (e.g., error detection or error correction) are received from the error management mode logic 587 as indicated in FIG. 5. Other information related to setting/adjusting the desired error management mode can also be communicated via OAM words. The FEC frames are then provided to the encoder 586 for FEC encoding. For example, the FEC frames may be encoded using Reed-Solomon encoding. The FEC frames are then mapped from bits to symbols by the bits-to-symbols mapper 588 and then converted to analog signals that are transmitted on the link 506 by the TX-line driver (PMA) 589. The transmissions are received by the RX front-end (PMA) 590 of node B 504, which converts the analog signals to received symbols, and the received symbols are mapped to bits by the symbols-to-bits mapper 591. The bits are then decoded by the decoder 592 according to the current configuration of the receiver. For example, the receiver may be configured to implement error detection only on incoming bits (e.g., EMM=ED) or the receiver may be configured to implement error correction (e.g., EMM=EC). As indicated in FIG. 5, the decoder includes processing blocks (e.g., processing blocks of a DSP) that include the syndrome calculation block 530, the error location block 532, and the error correction block 534. The processing blocks of the encoder are implemented on the incoming data bits as needed according to the configured error management mode. In the example of FIG. 5, if the receiver is configured to implement error detection only on incoming bits (e.g., EMM=ED), then as indicated by the "ED" path, the syndrome calculation block 530 processes the data and then the data is passed directly to the demultiplexer 593. However, if the receiver is configured to implement error correction on incoming bits (e.g., EMM=EC), then as indicated by the "EC" path, the syndrome calculation block 530, the error location block 532, and the error correction block 534 all process the data and then the data is passed to the demultiplexer 593. As illustrated in FIG. 5, when the receiver is configured for error detection only, some processing blocks of the decoder can be bypassed. In an embodiment, the bypassed processing blocks can be disabled (e.g., shut down or turned off) as a way to conserve power and reduce heat generation.

Once the FEC frames are passed through the decoder 592, the bits that make up an FEC frame are identified by the demultiplexer 593. For example, the bits of the FEC frames are identified as payload bits, OAM bits, or parity bits. The payload bits are then decoded by the $N_B/N_B+1$ decoder 594 and the decoded bits are passed to the XGMII 583, which can pass the bits to a higher layer application. In an embodiment, the OAM bits (e.g., in the form of an OAM word) are extracted from the FEC frames by the demultiplexer 593 and provided to the error management mode logic 587 as indicated in FIG. 5. As described herein, the OAM word may include an indication of the desired error management mode that can be used to configure the decoder 592 for decoding of subsequent bits. Other information related to setting/adjusting the error management mode can also be communicated via OAM words. The error management mode logic 587 can then use the OAM bits in the OAM word to determine if the error management mode of its receiver should be changed, e.g., changed from error detection to error correction or changed from error correction to error detection.

In an embodiment, it may be desirable to configure a receiver to receive a bit stream such as video (e.g., from a camera, radar, or LIDAR) in the error detection mode while still performing error correction on OAM bits that are embedded into the FEC frames. For example, it may be desirable to accurately decode the OAM bits, which are used to control aspects of the link, while a higher BER is acceptable for the payload data (e.g., video data from a camera, radar, or LIDAR). Thus, in an embodiment, the receiver can be configured to implement error detection on payload bits of a bit stream and to implement error correction on OAM bits in the bit stream. In such a case, at the transmit side, the transceiver may add at least one error correction bit to the OAM bits for use in error correction on the OAM bits.

Using an OAM word inserted into an FEC frame that also carries payload data to communicate changes in the error management mode provides for an efficient way to adapt the error management mode in real-time (e.g., "on-the-fly") to a mode of error management (e.g., error correction or error detection) that is desirable for the current set of circumstances.

Figure 6:
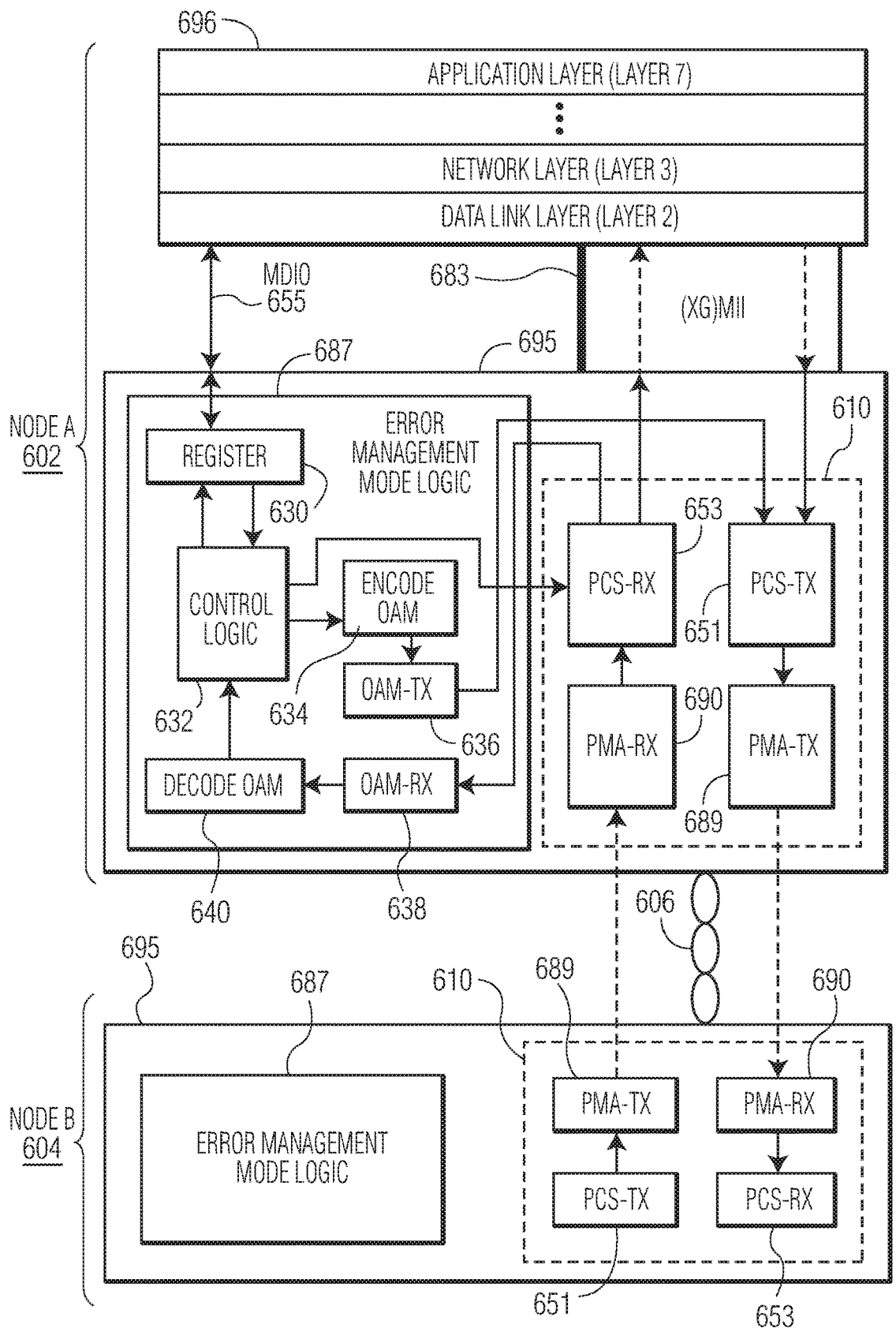
FIG. 6 depicts an example of components at the physical level of two nodes in a communications network that are connected by a link.

FIG. 6 depicts an example of components at the physical level of two nodes, node A 602 and node B 604, in a point-to-point communications network that are connected by a link 606. In the example of FIG. 6, the physical layers are embodied as integrated circuits 695 that incorporate physical layer functionality, referred to herein as "PHY chips." The PHY chips 695 may be components of the nodes A and B, respectively, and the nodes may include additional elements, such as elements of an electronic control unit (ECU) as is known in the field of in-vehicle networks. For example, ECUs may also include a microprocessor, a sensor, an actuator, etc. as is known in the field. FIG. 6 also depicts higher level layers of node A, e.g., the data link layer (layer 2, L2), the network layer (layer 3, L3), and the application layer (layer 7, L7), which may interact with the physical layer and which may be implemented at least in part by, for example, a microcontroller.

With reference to node A, 602, the PHY chip 695 includes a transceiver 610 that includes a physical coding sublayer transmitter (PCS-TX) 651, a physical medium attachment transmitter (PMA-TX) 689, a physical coding sublayer receiver (PCS-RX) 653, a physical medium attachment receiver (PMA-RX) 690, error management mode logic 687, a MII 683 (e.g., XGMII), and an MDIO 655. In the embodiment of FIG. 6, the error management mode logic 687 includes a register 630, control logic 632, an encode OAM module, 634, an OAM-TX module 636, an OAM-RX module 638, and a decode OAM module 640. Although not shown in FIG. 6, node B may include similar elements to node A, including, for example, the elements of the error management mode logic. The physical medium attachment transmitter (PCS-TX) 651, the physical medium attachment transmitter (PMA-TX) 689, the physical coding sublayer receiver (PCS-RX) 653, and the physical medium attachment receiver (PMA-RX) 690 perform functions that include functions which are known, for example, in the field of Ethernet based in-vehicle networks.

In the embodiment of FIG. 6, the register 630 of the error management mode logic 687 is a memory register that stores information that can be used to determine the desired error management mode that is employed by a PHY chip 695. The information may be read from the register or written to the register by a higher layer. For example, in the case of an Ethernet based link, an higher layer may request a PHY chip to transmit data with a lower BER or may indicated that a higher latency is acceptable.

In an embodiment, the encode OAM module 634 of the error management mode logic 687 is configured to encode information received from the control logic 632 into OAM bits. For example, the encode OAM module is configured to encode the desired error management mode into an OAM word according to OAM encoding rules. For example, a control command to configure a receiver to a particular error management mode, e.g., error detection or error correction, may be encoded into an 8-bit OAM word.

In an embodiment, the OAM-TX module 636 of the error management mode logic 687 is configured to buffer the encoded OAM bits (e.g., as an OAM word) before the encoded OAM bits are embedded into the payload field of an FEC frame. For example, an OAM word is embedded into a stream of data that makes up the payload of an FEC frame. In an embodiment, the OAM-TX module includes a buffer for temporarily storing the OAM bits before the OAM bits are embedded into the payload field of an FEC frame.

In an embodiment, the OAM-RX module 638 of the error management mode logic 687 is configured to buffer encoded OAM bits (e.g., as an encoded OAM word) that have been extracted from the payload field of an FEC frame. For example, an OAM word is extracted from a stream of data that makes up the payload. In an embodiment, the OAM-RX module includes a buffer for temporarily storing the extracted encoded OAM word.

In an embodiment, the decode OAM module 640 of the error management mode logic 687 is configured to decode the encoded OAM word that is extracted from the payload field of the FEC frame and to pass the decoded information to the control logic 632. For example, the decode OAM module is configured to decode the OAM word to a control command that is understood by the control logic. For example, an 8-bit OAM word is decoded into a control command, which is understood by the control logic, to configure the receiver to implement a desired error management mode. In an embodiment, the encode OAM module and the decode OAM module encode and decode according to a complementary set of encoding and decoding rules.

In an embodiment, the control logic 632 of each node controls the operation of the error management mode logic 687. For example, the control logic enables a node to adapt the error management mode of the receiver to the particular application that is utilizing the link. For example, the control logic is configured to be able to adapt the PHY chip 695 to an error management mode that is compatible with the particular application that the PHY chip is supporting. In an example, the control logic of two nodes are able to determine when to change the error management mode of the decoder of the receiver of at least one of the nodes and are able to communicate the determination between the two nodes so that the decoder of at least one of the two nodes can be operated at the desired functionality level.

In an example of a transmission operation, the register 630 receives information about the desired error management mode from a higher layer. The control logic 632 is configured to evaluate the information in the register to determine a desired error management mode for a receiver, e.g., the local receiver and/or the remote receiver. The desired error management mode that is determined by the control logic is provided to the encode OAM module 634, wherein an indication of the desired error management mode is encoded into OAM bits, e.g., of an OAM word. The OAM bits are then provided to the OAM-TX module 636, which may include buffering memory and/or logic to provide the OAM bits (e.g., as an OAM word) to the transceiver 610 for insertion into an FEC frame. The FEC frames, including at least one FEC frame with the encoded OAM bits, are transmitted on the link 606 as analog signals by the PMA-TX 689.

In an example of a receive operation, the PMA-RX 690 of node A 602 receives electrical signals on the link 606, decodes the signals into symbols, and provides the symbols to the PCS-RX 653. The PCS-RX maps the symbols to a bit stream and demultiplexes the OAM bits and the payload bits as described with reference to FIG. 5. An OAM word extracted from an FEC frame by the PCS-RX 653 is provided to the OAM-RX module 638, e.g., for buffering. The OAM word is then decoded by the decode OAM module 640 and an indication of the desired error management mode is provided to the control logic 632 in a format that can be understood by the control logic. In response to the information about the desired error management mode, the control logic may provide a configuration command to the receiver (e.g., the PCS-RX 653) to configure the receiver to implement the desired error management mode. For example, the control logic may provide a configuration command that the error management mode should be error detection (e.g., EMM=ED) or a configuration command that the error management mode should be error correction (e.g., EMM=EC).

As described above, the desired error management mode can be determined at, for example, node A and provided to node B. An example of providing error management mode information is now described with reference to FIGS. 6, 7A, and 7B. In particular, an example of a transmission operation to provide error management mode information is described with reference to FIGS. 6 and 7A and an example of a receive operation to share information is described with reference to FIGS. 6 and 7B. The examples of FIGS. 7A and 7B illustrate PDUs, e.g., Ethernet PDUs, and the OAM words are embedded into FEC frames (see FIG. 2A) that correspond to data in the payload field of the PDUs.

Figure 7A:
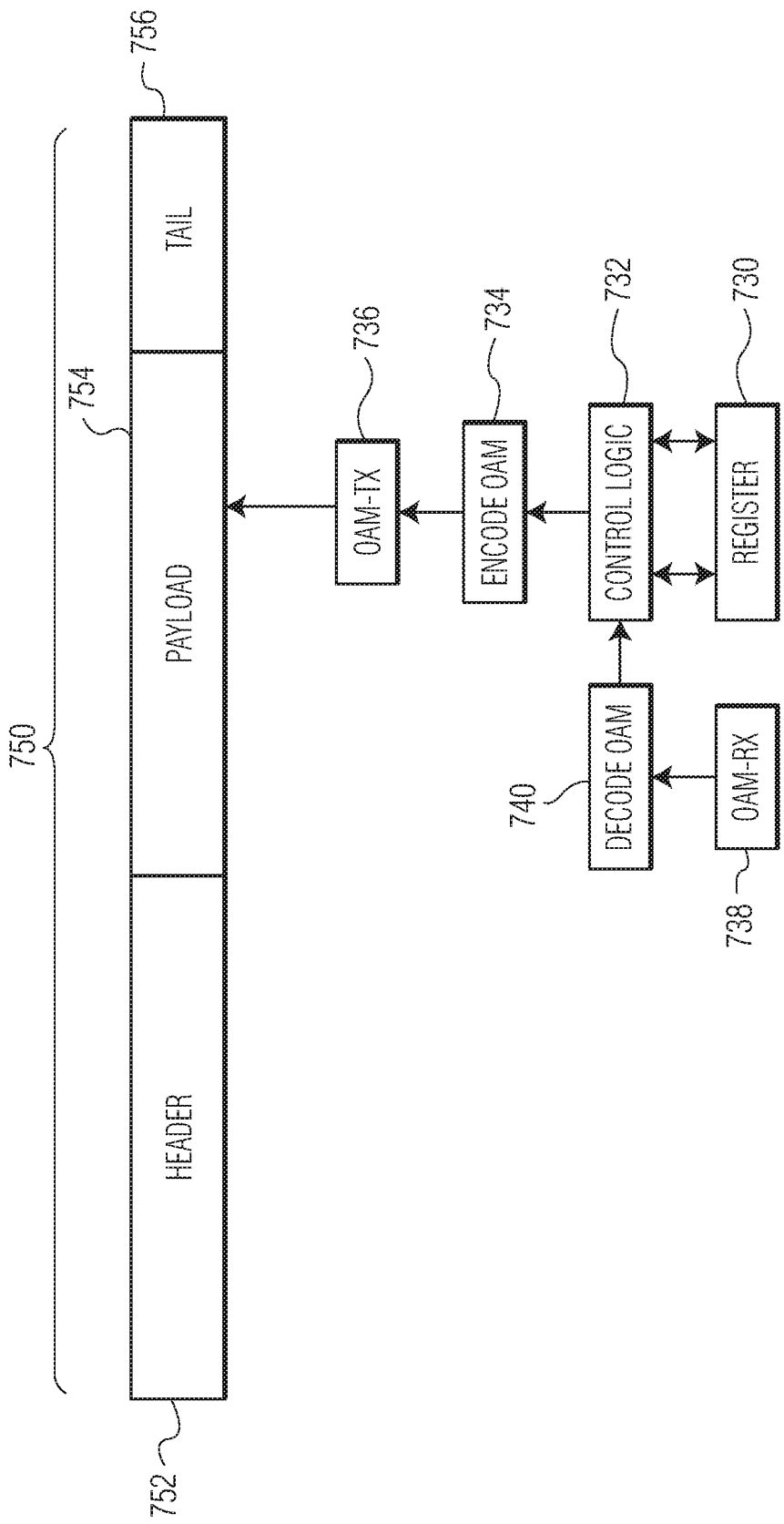
FIG. 7A illustrates an example of a transmission operation to share information between two nodes.

With reference to FIG. 7A, a PDU 750 includes a header field 752, a payload field 754, and a tail field 756. In the example of FIGS. 6, 7A, and 7B, the PDU is transmitted from node A to node B. FIG. 7A illustrates a process for embedding control information into the payload field of PDUs, e.g., control information about the error management mode. As illustrated in FIG. 7A, the control logic 732 may receive data from the register 730, such as a command to change the error management mode. The control logic may also receive data from the decode OAM module 740 and OAM-RX module 738 such as information related to the capabilities of the other receiver. The control logic then determines the control information that is to be sent to the other node, e.g., to node A, encodes the information into an OAM word (or OAM words) at the encode OAM module 734, and then buffers the OAM word at the OAM-TX module 736 before the OAM bits are embedded into the payload field 754 of the PDU. In an embodiment, the PDU is an Ethernet PDU and the OAM word is embedded into an FEC frame (see FIG. 2A), which carries at least a portion of the bits that form the payload field of the PDU. The PDU is then transmitted across the communications medium to the other node, e.g., to node A.

Figure 7B:
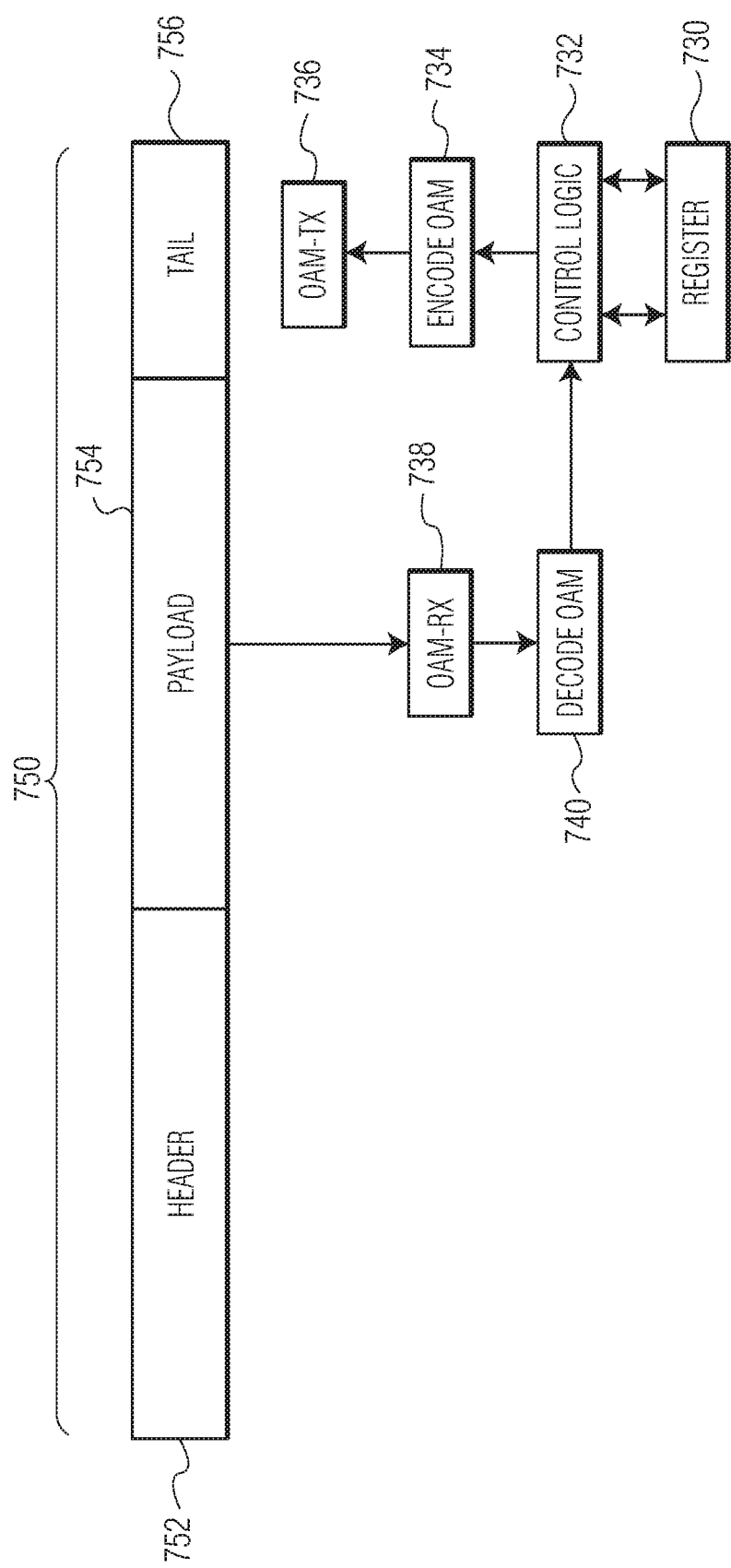
FIG. 7B illustrates an example of a receive operation to share information between two nodes.

With reference to FIG. 7B, the PDU 750 transmitted from node A across the communications medium is received at node B. As illustrated in FIG. 7B, control information, which is carried in OAM bits, is extracted from the payload field 754 of the PDU 750. For example, the OAM bits are extracted from an FEC frame (see FIG. 2A), which carries a portion of the bits that form the payload field of the PDU, e.g., the Ethernet PDU. The extracted OAM bits are provided to the OAM-RX module 738 for buffering and then decoded by the decode OAM module 740 into control information that can be understood by the control logic 732. The decoded control information is then provided to the control logic, which can use the information to set a register 730 and/or to generate additional control information that is to be transmitted to other nodes, e.g., to node A via the encode OAM module 734 and the OAM-TX module 736. The control logic may also use the decoded control information to configure its receiver.

Figure 8A:
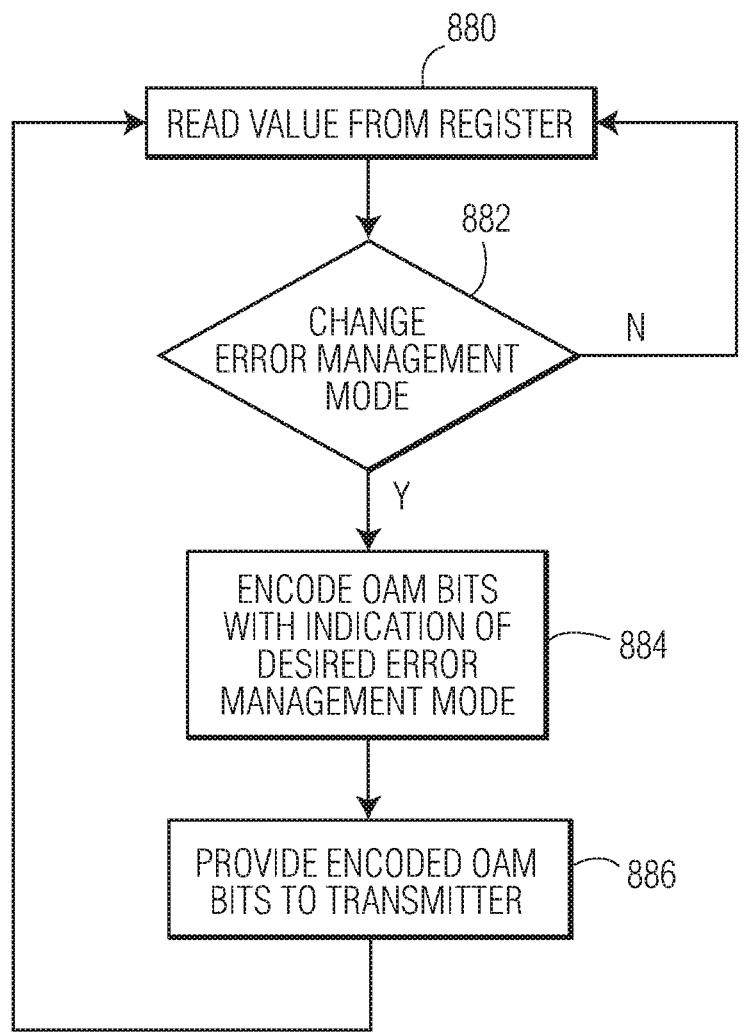
FIG. 8A is a process flow diagram of transmit-related operations performed at the physical level by the error management mode logic described above with reference to FIGS. 5 and 6.

FIG. 8A is a process flow diagram of transmit-related operations performed at the physical layer by the error management mode logic described above with reference to FIGS. 5 and 6. At block 880, a value is read from a register. At decision point 882, it is determined if the error management mode should be changed. For example, the determination is made in response to the value read from the register. If it is determined that the error management mode should not be changed, the process returns to block 880. If, however, it is determined that the error management mode should be changed, then at block 884, OAM bits are encoded with an indication of the desired error management mode. At block 886, the encoded OAM bits are provided to the transmitter, which transmits the OAM bits onto the network, and the process returns to block 880.

Figure 8B:
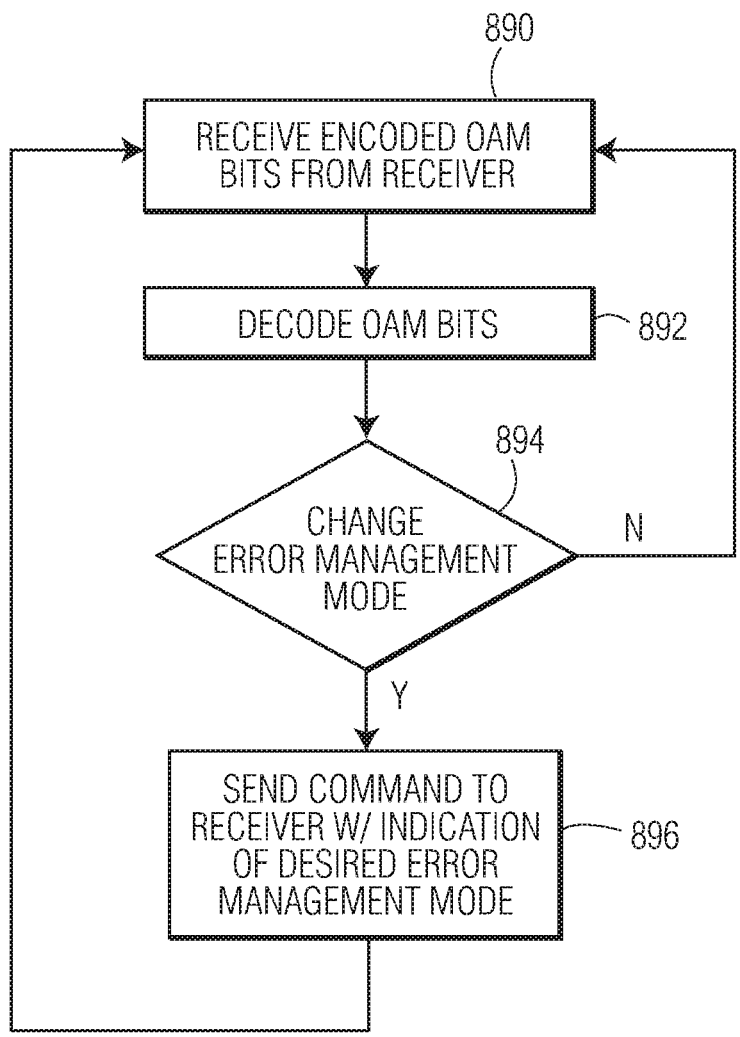
FIG. 8B is a process flow diagram of receive-related operations performed at the physical level by the error management mode logic described above with reference to FIGS. 5 and 6.

FIG. 8B is a process flow diagram of receive-related operations performed at the physical layer by the error management mode logic described above with reference to FIGS. 5 and 6. At block 890, encoded OAM bits are received from a receiver. At block 892, the encoded OAM bits are decoded into information that can be understood by the control logic. At decision block 894, it is determined if the error management mode should be changed. For example, the determination is made in response to decoded information. If it is determined that the error management mode should not be changed, the process returns to block 890. If, however, it is determined that the error management mode should be changed, then at block 896, a command that indicates the change of the error management mode is sent to the receiver and then the process returns to block 890.

The above-described operations of the error management mode logic can be implemented in hardware, firmware, software, or a combination thereof. In an embodiment, the error management logic is implemented in a PHY chip with hardware logic circuits. In another embodiment, the PHY chip may include an instruction processor and the error management logic can be implemented through computer readable instructions that are executed by the instruction processor.

In an embodiment, OAM bits may be used by a node to communicate with a remote node to agree on the timing to start a new configuration, e.g., to implement a change in the error management mode. In an embodiment, OAM bits are used by a receiving node to learn the status of the physical layer (e.g., PHY chip) of a transmitting node and/or to communicate certain defined/agreed actions. The OAM bits can be used to communicate between two PHY chips to agree on the timing to start a new configuration, e.g., a new error management mode.

In an embodiment, the elements of the physical layer as shown in FIGS. 5 and 6 can be integrated into an IC device that includes other functionality, such as microprocessor functionality. For example, the components of a traditional PHY chip can be integrated onto a System-on-Chip (SoC).

In an embodiment, the OAM bits are used to pass information from a local PHY chip to a remote PHY chip. As shown in FIG. 7, the OAM bits are embedded into the bit stream of data that is received from a higher layer, e.g., from the data link layer. The OAM bits may include information related to, for example, node health, control, managing link partners, interoperability, and interleaving.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for performing physical layer operations in a communications network, the method comprising:
   determining an error management mode for a receiver at a first network node, wherein determining an error management mode comprises selecting either error correction or error detection as the error management mode;
   at the first network node, embedding an indication of the error management mode into a forward error correction (FEC) frame, wherein embedding an indication of the error management mode into an FEC frame comprises embedding an operations, administration, and management (OAM) word into the FEC frame to communicate the indication of the error management mode, wherein the OAM word includes at least one bit that indicates whether the error management mode is either error correction or error detection, wherein the OAM word is embedded into the FEC frame at a physical coding sublayer transmitter (PCS-TX) of the first network node; and
   transmitting the FEC frame from the first network node;
   at a second network node:
   receiving the FEC frame at a receiver of the second network node;
   extracting the indication of the error management mode from the FEC frame, wherein extracting the indication of the error management mode from the FEC frame comprises extracting the OAM word from the FEC frame;
   within the physical layer of the second network node, providing the indication of the error management mode, which was extracted from the FEC frame, to physical layer error mode management logic;
   configuring a decoder of the receiver of the second network node to operate in an error management mode in response to an error correction control signal or an error detection control signal that is generated by the error mode management logic in response to the indication of the error management mode; and
   operating the receiver of the second network node in the error management mode as configured using the indication of the error management mode, wherein the receiver of the second network node operates in either an error correction mode or an error detection mode.

2. The method of claim 1, wherein determining an error management mode comprises reading a register bit at the physical layer.

3. The method of claim 1, wherein determining an error management mode comprises reading a register bit at the physical layer that is set by a layer higher than the physical layer.

4. The method of claim 1, further comprising, at the first network node:
   receiving an FEC frame at a receiver of the first network node;
   extracting an indication of the error management mode from the FEC frame;
   configuring the receiver of the first network node to operate in an error management mode using the indication of the error management mode; and
   operating the receiver of the first network node in the error management mode as configured using the indication of the error management mode.

5. A method for performing physical layer operations in a communications network, the method comprising:
   at a first network node;
   determining an error management mode for a receiver at a first network node, wherein determining an error management mode comprises selecting either error correction or error detection as the error management mode;
   embedding an indication of the error management mode into a forward error correction (FEC) frame; and
   transmitting the FEC frame from the first network node;
   at a second network node;
   receiving the FEC frame at a receiver of the second node;
   extracting the indication of the error management mode from the FEC frame and;
   configuring a decoder of the receiver of the second network node to operate in an error management mode in response to the indication of the error management mode; and
   operating the receiver of the second network node in the error management mode as configured using the indication of the error management mode, wherein the receiver of the second network node operates in either an error correction mode or an error detection mode;
   wherein embedding an indication of the error management mode into an FEC frame comprises embedding an operations, administration, and management (OAM) word into a payload field of the FEC frame to communicate the indication of the error management mode, and wherein the OAM word is embedded into the payload field of the FEC frame at a physical coding sublayer transmitter (PCS-TX) of the first network node and wherein the OAM word is extracted from the FEC frame at a physical coding sublayer receiver (PCS-RX) of the second network node;
   wherein the extracted OAM word is provided to physical layer error management mode logic that controls the error management mode of the decoder.

6. The method of claim 5, wherein determining an error management mode comprises reading a register bit at the physical layer.

7. The method of claim 5, wherein determining an error management mode comprises reading a register bit at the physical layer that is set by a layer higher than the physical layer.

8. A physical layer (PHY) device for a communications network, the PHY device comprising:
   a transmitter configured to transmit forward error correction (FEC) frames from the PHY device;
   a receiver configured to receive FEC frames at the PHY device; and
   error management mode logic configured to;

determine an error management mode, wherein the error management mode is either error correction or error detection;

provide an indication of the error management mode to the transmitter;

receive an indication of an error management mode from a physical coding sublayer receiver (PCS-RX) of the receiver; and configure a decoder of the receiver to operate in the error management mode using the indication of the desired error management mode;

wherein the transmitter is configured to embed an operations, administration, and management (OAM) word into an FEC frame before transmission, the OAM word including the indication of the error management mode provided by the error management mode logic;

wherein the receiver is configured to extract an OAM word from the FEC frame and to provide the OAM word to the error management mode logic, the OAM word including an indication of the error management mode.

\* \* \* \* \*